US010446372B2

(12) United States Patent
Koo et al.

(10) Patent No.: US 10,446,372 B2
(45) Date of Patent: *Oct. 15, 2019

(54) DUAL CATHODE ION SOURCE

(71) Applicant: Varian Semiconductor Equipment Associates, Inc., Gloucester, MA (US)

(72) Inventors: Bon-Woong Koo, Andover, MA (US); Jun Lu, Beverly, MA (US); Frank Sinclair, Boston, MA (US); Eric D. Hermanson, Georgetown, MA (US); Joseph E. Pierro, Danvers, MA (US); Michael D. Johnson, Peabody, MA (US); Michael S. DeLucia, Gloucester, MA (US); Antonella Cucchetti, Manchester-by-the-Sea, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/936,966

(22) Filed: Mar. 27, 2018

(65) Prior Publication Data

US 2018/0211808 A1 Jul. 26, 2018

Related U.S. Application Data

(63) Continuation of application No. 15/416,131, filed on Jan. 26, 2017, now Pat. No. 9,978,554.

(51) Int. Cl.
*H01J 37/317* (2006.01)
*H01J 37/08* (2006.01)
(Continued)

(52) U.S. Cl.
CPC ............ *H01J 37/3171* (2013.01); *H01J 1/50* (2013.01); *H01J 27/08* (2013.01); *H01J 37/08* (2013.01);
(Continued)

(58) Field of Classification Search
None
See application file for complete search history.

(56) References Cited

U.S. PATENT DOCUMENTS

| | | | |
|---|---|---|---|
| 6,184,532 B1 | 2/2001 | Dudnikov et al. | |
| 6,356,026 B1 * | 3/2002 | Murto | H01J 27/08 250/426 |

(Continued)

FOREIGN PATENT DOCUMENTS

| | | |
|---|---|---|
| CN | 103247505 A | 8/2013 |
| CN | 103871809 A | 6/2014 |

OTHER PUBLICATIONS

International Search Report and Written Opinion dated Mar. 22, 2018 in corresponding PCT application No. PCT/US2017/061913.
(Continued)

*Primary Examiner* — Jany Richardson
(74) *Attorney, Agent, or Firm* — Nields, Lemack & Frame, LLC

(57) ABSTRACT

An ion source having dual indirectly heated cathodes is disclosed. Each of the cathodes may be independently biased relative to its respective filament so as to vary the profile of the beam current that is extracted from the ion source. In certain embodiments, the ion source is used in conjunction with an ion implanter. The ion implanter comprises a beam profiler to measure the current of the ribbon ion beam as a function of beam position. A controller uses this information to independently control the bias voltages of the two indirectly heated cathodes so as to vary the uniformity of the ribbon ion beam. In certain embodiments, the current passing through each filament may also be independently controlled by the controller.

13 Claims, 5 Drawing Sheets

(51) Int. Cl.
*H01J 27/08* (2006.01)
*H01J 1/50* (2006.01)

(52) U.S. Cl.
CPC .......... *H01J 2237/30472* (2013.01); *H01J 2237/31701* (2013.01)

(56) References Cited

U.S. PATENT DOCUMENTS

| | | |
|---|---|---|
| 6,525,482 B2 | 2/2003 | Miyamoto |
| 6,555,831 B1 | 4/2003 | Konishi et al. |
| 8,072,149 B2 | 12/2011 | Cho et al. |
| 8,147,705 B2 | 4/2012 | Inouchi et al. |
| 2001/0043040 A1* | 11/2001 | Olson .............. H01J 27/022 313/446 |
| 2009/0078890 A1* | 3/2009 | Yamashita .......... H01J 27/14 250/492.3 |
| 2009/0212232 A1 | 8/2009 | Yamashita et al. |
| 2009/0243490 A1 | 10/2009 | Cho et al. |
| 2013/0313443 A1 | 11/2013 | Koo et al. |
| 2015/0001068 A1 | 1/2015 | Tsunekawa |

OTHER PUBLICATIONS

Office action dated Sep. 22, 2017 in co-pending U.S. Appl. No. 15/416,131.
Notice of allowance dated Feb. 14, 2018 in co-pending U.S. Appl. No. 15/416,131.

\* cited by examiner

DUAL CATHODE ION SOURCE

This application is a continuation of U.S. patent application Ser. No. 15/416,131 filed Jan. 26, 2017, the disclosure of which is incorporated herein by reference in its entirety.

FIELD

Embodiments relate to an apparatus and method for tuning a ribbon ion beam extracted from an ion source, and more particularly, to independently tuning the power levels to each cathode in a dual cathode ion source.

BACKGROUND

Ions are used in a plurality of semiconductor processes, such as implantation, amorphization, deposition and etching processes. These ions may be created within an ion source chamber and extracted through an extraction aperture in the ion source chamber.

In certain embodiments, the ion source comprises an indirectly heated cathode. A filament is disposed behind the cathode and energized to emit thermionic electrons. These electrons then strike the back surface of the cathode, causing the cathode to increase in temperature and emit electrons into the ion source chamber. These energized electrons collide with a feed gas in the ion source chamber to create ions, which can be extracted through an extraction aperture in the ion source.

In some embodiments, the extraction aperture is in the shape of an elongated slit, having a length that is much greater than its height. The ions are extracted through this extraction aperture in the form of a ribbon ion beam. One parameter that is monitored in ion implanters is ion beam uniformity. This term refers to the consistency of beam current across the entire length of the ribbon ion beam. Components that are located downstream from the ion source may be utilized to compensate for any non-uniformity in the ribbon ion beam extracted from the ion source. However, these components tend to reduce the overall beam current and may cause the ion beam to lose some amount of parallelism.

Thus, it would be beneficial if there were an apparatus that allowed improved control over the ion beam that is extracted from the ion source. Further, it would be advantageous if there were a method to control that apparatus which allowed the ribbon ion beam to be tuned without sacrificing beam current and parallelism.

SUMMARY

An ion source having dual indirectly heated cathodes is disclosed. Each of the cathodes may be independently biased relative to its respective filament so as to vary the profile of the beam current that is extracted from the ion source. In certain embodiments, the ion source is used in conjunction with an ion implanter. The ion implanter comprises a beam profiler to measure the current of the ribbon ion beam as a function of beam position. A controller uses this information to independently control the bias voltages of the two indirectly heated cathodes so as to vary the uniformity of the ribbon ion beam. In certain embodiments, the current passing through each filament may also be independently controlled by the controller. Further, in certain embodiments, each cathode is independently biased relative to the ion source.

According to one embodiment, an ion source is disclosed. The ion source comprises a first end wall and a second end wall; chamber walls connected to the first end wall and the second end wall to define an ion source chamber, wherein one of the chamber walls comprises an extraction aperture, wherein a ribbon ion beam is extracted through the extraction aperture; a first cathode disposed proximate the first end wall; a first filament disposed between the first end wall and the first cathode; a first bias power supply to bias the first cathode relative to the first filament; a second cathode disposed proximate the second end wall; a second filament disposed between the second end wall and the second cathode; and a second bias power supply, different from the first bias power supply, to bias the second cathode relative to the second filament. In certain embodiments, an output of the first bias power supply is different from an output of the second bias power supply, so as to change a uniformity of the ribbon ion beam extracted through the extraction aperture.

In some embodiments, the ion source is part of an ion implanter. The ion implanter comprises the ion source, a beam profiler for measuring a beam current of the ribbon ion beam as a function of beam position; and a controller in communication with the ion source and the beam profiler, such that the controller controls an output of the first bias power supply and the second bias power supply so as to vary a uniformity of beam current of the ribbon ion beam. In certain embodiments, the ion implanter further comprises a corrector magnet, wherein the controller controls the corrector magnet to improve uniformity of the ribbon ion beam after adjusting the output of the first bias power supply and the second bias power supply. In some embodiments, the controller determines the uniformity of the ribbon ion beam based on input from the beam profiler and adjusts the output of the first bias power supply and the second bias power supply so as to improve the uniformity of the beam current. In certain embodiments, the ion source further comprises a first arc power supply to bias the first cathode relative to walls of the ion source and a second arc power supply to bias the second cathode relative to the walls of the ion source, wherein the controller controls an output of the first arc power supply and the second arc power supply so as to vary uniformity of the beam current of the ribbon ion beam.

According to another embodiment, an ion implanter is disclosed. The ion implanter comprises an ion source, comprising a first end wall and a second end wall; chamber walls connected to the first end wall and the second end wall to define an ion source chamber, wherein one of the chamber walls comprises an extraction aperture through which a ribbon ion beam is extracted; a first cathode disposed proximate the first end wall; a first filament disposed between the first end wall and the first cathode; a first bias power supply to bias the first cathode relative to the first filament; a first arc power supply to bias the first cathode relative to the chamber walls; a second cathode disposed proximate the second end wall; a second filament disposed between the second end wall and the second cathode; a second bias power supply, different from the first bias power supply, to bias the second cathode relative to the second filament; and a second arc power supply to bias the second cathode relative to the chamber walls; a beam profiler for measuring a beam current of the ribbon ion beam as a function of beam position; and a controller in communication with the ion source and the beam profiler, such that the controller adjusts at least one of a plurality of the parameters of the ion source so as to vary uniformity of beam current of the ribbon ion beam, wherein the parameters are selected from the group consisting of filament currents, bias voltages supplied by the first bias power supply and the second bias power supply, and arc voltages supplied by the first arc power supply and the second arc power supply. In certain embodiments, the controller controls at least two parameters. In certain embodiments, the controller determines the uniformity of the ribbon ion beam based on input from the beam profiler and adjusts the at least one of the parameters so as to improve the uniformity of the beam current.

According to another embodiment, a method of adjusting a uniformity of a ribbon ion beam extracted from a dual cathode ion source is disclosed. The method comprises measuring a current of the ribbon ion beam across its length at a plane of a workpiece; and adjusting a parameter of the dual cathode ion source to adjust the uniformity of the ribbon ion beam in response to a measured current, wherein the parameter of the dual cathode ion source is selected from the group consisting of a current flowing through a first filament, a current flowing through a second filament, a voltage between the first filament and a first cathode; a voltage between the second filament and a second cathode; a voltage between the first cathode and a wall of the dual cathode ion source and a voltage between the second cathode and the wall of the dual cathode ion source. In certain embodiments, the uniformity is adjusted by making the voltage between the first filament and the first cathode different from the voltage between the second filament and the second cathode. In certain embodiments, the uniformity is adjusted by making the voltage between the first cathode and the wall of the dual cathode ion source different from the voltage between the second cathode and the wall of the dual cathode ion source.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
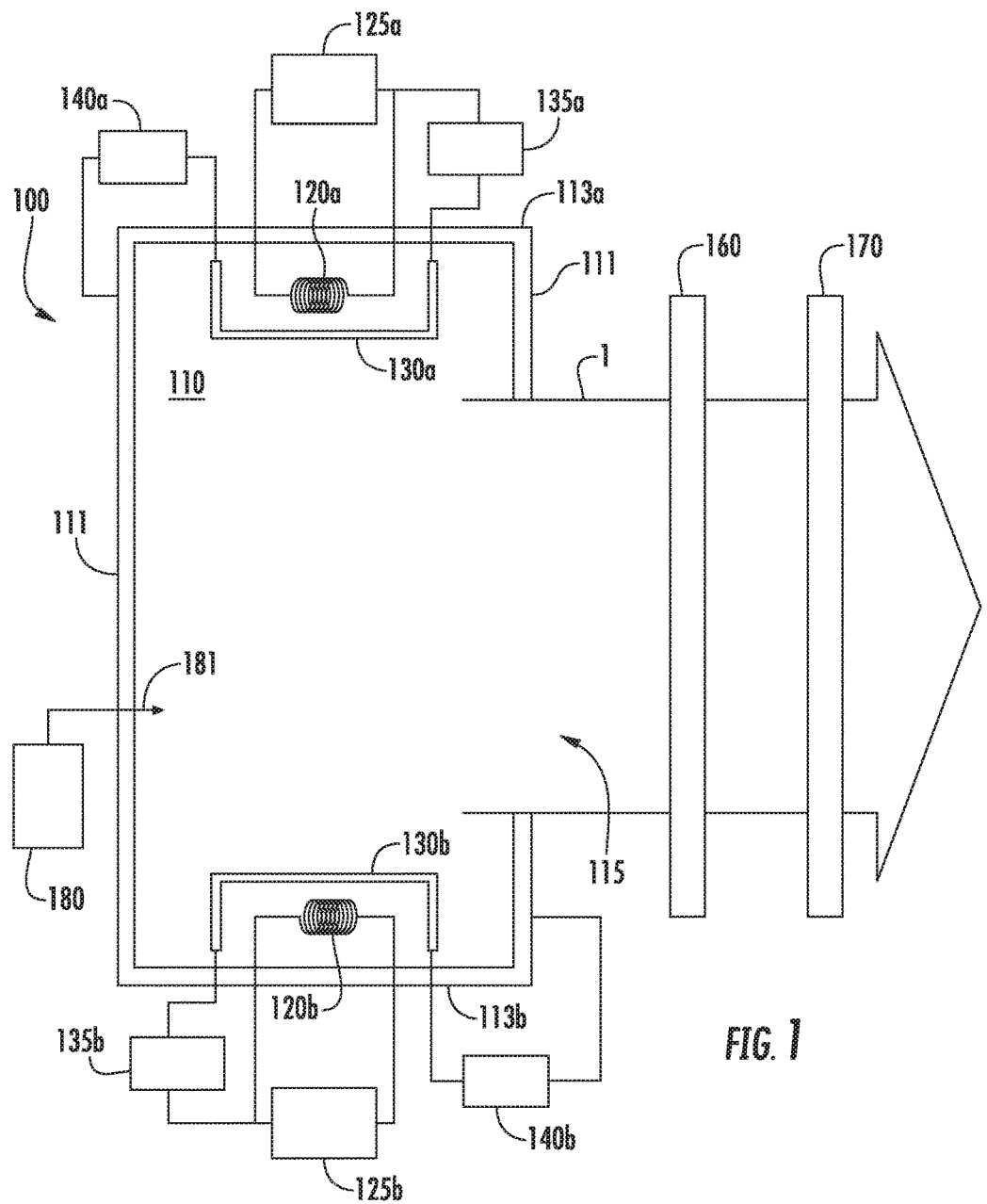
FIG. 1 shows a dual cathode ion source for controlling the uniformity of the ribbon ion beam as it is extracted from the ion source according to one embodiment.

FIG. 1 shows a first embodiment of a dual cathode ion source 100 that may be used to control uniformity of a ribbon ion beam 1 as it is extracted from the ion source. In this embodiment, the ion source 100 comprises a plurality of chamber walls 111 and two end walls 113, defining an ion source chamber 110.

The dual cathode ion source 100 may have one dimension that is longer than the other two dimensions. This dimension may be referred to as the length of the ion source. The four chamber walls 111 extend in the length dimension. The other two chamber walls may be referred to as end walls 113a, 113b. The one of the four chamber walls 111 that extends in the length dimension includes an extraction aperture 115. The chamber wall 111 that includes the extraction aperture 115 may be referred to as the faceplate. The extraction aperture 115 may be configured such that its length is much greater than its height. In certain embodiments, the length of the extraction aperture 115 may be more than 100 mm, although other dimensions are also possible. The height of the extraction aperture 115 may be much smaller, such as about 5 mm or less.

Disposed on each end wall 113a, 113b is an indirectly heated cathode. A first filament 120a extends into the ion source chamber 110, proximate end wall 113a. This first filament 120a is electrically conductive and is in communication with a first filament power supply 125a. The first filament power supply 125a is used to supply a current that passes through the first filament 120a. A first cathode 130a is disposed in the ion source chamber 110 such that the first filament 120a is disposed between the first cathode 130a. This arrangement limits the exposure of the first filament 120a to the gasses, plasma and ions that are disposed in the ion source chamber 110. The first cathode 130a is also made of an electrically conductive material, such as titanium, graphite, molybdenum or tungsten. A first bias power supply 135a is used to bias the first cathode 130a relative to the first filament 120a. For example, the first cathode 130a may be biased positively relative to the first filament 120a so as to attract the thermionic electrons emitted by the first filament 120a toward the first cathode 130a. The first cathode 130a may be biased relative to the first filament 120a by using the bias power supply 135a to output a voltage. Alternatively, the first bias power supply 135a may be configured to supply a current to create the bias between the first filament 120a and the first cathode 130a. The combination of the first filament 120a and the first cathode 130a form a first indirectly heated cathode.

The second end wall 113b also includes a second filament 120b, a second filament power supply 125b, a second cathode 130b and a second bias power supply 135b. These components operate in the same manner as described above. Thus, the second filament 120b and the second cathode 130b form a second indirectly heated cathode.

When two filament power supplies 125a, 125b are used, the current supplied to each filament 120a, 120b may be different. In certain embodiments, a single filament power supply is used to supply current to both filaments 120a, 120b.

The bias power supplies 135a, 135b may be independently controlled such that the output by each bias power supply 135a, 135b may be different. The ability to independently control the bias voltage to each cathode 130a, 130b is beneficial in the ability to tune the ribbon ion beam 1.

The ion source 100 also includes two arc power supplies 140a, 140b which are used to bias the cathodes 130a, 130b, respectively, relative to the chamber walls 111. By utilizing two arc power supplies 140a, 140b, it is possible to separately bias each cathode 130a, 130b relative to the chamber walls 111. The chamber walls 111 may be biased positively relative to the cathodes 130a, 130b so that electrons emitted from the cathodes 130a, 130b can be accelerated equivalent to the bias voltage, collide with neutral species and generate ions. In certain embodiments, there may be one arc power supply such that both cathodes 130a, 130b is commonly biased relative to the chamber walls 111.

Located outside the ion source chamber 110 and proximate the extraction aperture 115 are one or more electrodes. In one embodiment, there is a suppression electrode 160 disposed proximate the extraction aperture 115. The suppression electrode 160 has a suppression aperture through which the ribbon ion beam 1 passes. There may also be a ground electrode 170 disposed proximate the suppression electrode 160. The ground electrode 170 has a ground aperture through which the ribbon ion beam 1 passes. The suppression electrode 160 and the ground electrode 170 are both made from an electrically conductive material. The suppression electrode 160 may be negatively biased relative to the chamber walls 111, such as by a suppression power supply, so as to extract and focus the positive ions through the extraction aperture 115. The ground electrode 170 may be grounded.

In operation, a feed gas, stored in a gas container 180, is introduced into the ion source chamber 110 via a gas inlet 181. Power is supplied from the filament power supplies 125a, 125b to the filaments 120a, 120b, which causes current to pass through these filaments 120a, 120b. As the filaments 120a, 120b heat, thermionic electrons are emitted. These electrons are attracted toward the respective cathode 130a, 130b since the cathodes 130a, 130b are positively biased relative to the filaments 120a, 120b. The bombardment of electrons into the back surface of the cathodes 130a, 130b cause the cathodes 130a, 130b to become hot enough to emit electrons from the front surface into the ion source chamber 110.

The electrons emitted from the cathodes 130a, 130b collide with the feed gas to create ions in the ion source chamber 110. These ions are then extracted from the ion source chamber 110 through the extraction aperture 115 in the form of a ribbon ion beam 1. The ribbon ion beam 1 then passes through the suppression aperture in the suppression electrode 160 and the ground aperture in the ground electrode 170, and continues through the ion implanter.

Figure 2:
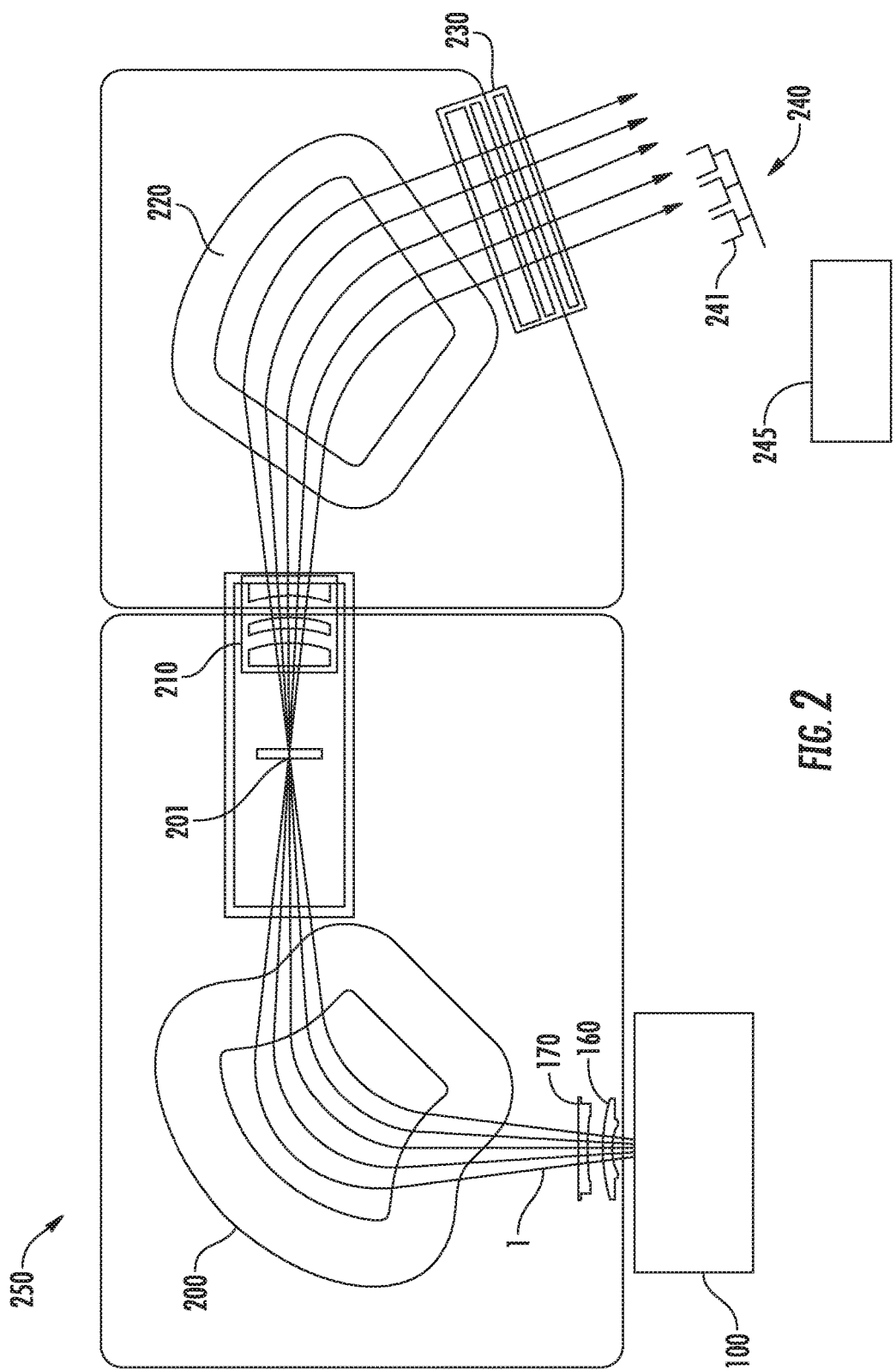
FIG. 2 shows an ion implanter system that utilizes the dual cathode ion source of FIG. 1.

FIG. 2 shows a representative ion implanter 250 that utilizes the ion source 100. After the ribbon ion beam 1 passes through the suppression electrode 160 and the ground electrode 170, the ribbon ion beam 1 enters a mass analyzer 200. The mass analyzer 200, having a resolving aperture 201, is used to remove unwanted components from the ribbon ion beam 1, resulting in a ribbon ion beam 1 having the desired energy and mass characteristics passing through resolving aperture 201. Ions of the desired species then pass through a first deceleration stage 210, which may include one or more electrodes. The output of the first deceleration stage 210 may be a diverging ion beam.

A corrector magnet 220 is adapted to deflect the divergent ion beam into a set of individual beamlets having substantially parallel trajectories. The corrector magnet 220 may comprise a magnetic coil and magnetic pole pieces that are spaced apart to form a gap, through which the ion beamlets pass. The magnetic coil is energized so as to create a magnetic field within the gap, which deflects the ion beamlets in accordance with the strength and direction of the applied magnetic field. The magnetic field is adjusted by varying the current through the magnetic coil. Alternatively, other structures, such as parallelizing lenses, can also be utilized to perform this function.

In certain embodiments, the corrector magnet 220 may also comprise other components that are used to improve the uniformity of the ribbon ion beam 1. For example, quadrature pole magnets, rods and energy purity modules may be employed to manipulate the ribbon ion beam 1, attempting to improve its uniformity. These components manipulate the ribbon ion beam 1 so as to make the beam current nearly uniform across its entire length, while maintaining the parallelism of the individual ion beamlets.

Following the corrector magnet 220, the ribbon ion beam 1 is targeted toward the workpiece. In some embodiments, a second deceleration stage 230 may be added between the workpiece and the second deceleration stage 230.

A beam profiler 240 may also be disposed downstream from the second deceleration stage 230. In one embodiment, the beam profiler 240 may comprise a plurality of charge or current collectors, known as dose cups 241, which are arranged along the length of the ribbon ion beam. In other embodiments, the dose cups 241 are scanned across the ion beam to measure beam characteristics such as beam current, uniformity and beam angles. In this way, it is possible to analyze the beam current as a function of beam position. This information may be used to tune the ribbon ion beam, as will be described in more detail below.

The beam profiler 240 is disposed at the position where the workpiece is normally disposed. In other words, the beam profiler 240 measures the ribbon ion beam 1 at the same position where it impacts the workpiece. After the beam profiler 240 has finished scanning, it is moved to a stowed position so that the workpiece may be disposed in the path of the ribbon ion beam 1.

Further, a controller 245 may be disposed in the ion implanter 250. The controller 245 may include a processing unit and a storage element. The storage element may be any suitable non-transitory memory device, such as semiconductor memory (i.e. RAM, ROM, EEPROM, FLASH RAM, DRAM, etc.), magnetic memory (i.e. disk drives), or optical memory (i.e. CD ROMs). The storage element may be used to contain the instructions, which when executed by the processing unit in the controller 245, allow the ribbon ion beam 1 to be tuned, as described in more detail below.

The controller 245 may be in communication with the beam profiler 240. The controller 245 may also be in communication with the first bias power supply 135a, the second bias power supply 135b, the first filament power supply 125a, the second filament power supply 125b, the first arc power supply 140a, the second arc power supply 140b and the corrector magnet 220.

Figure 3A:
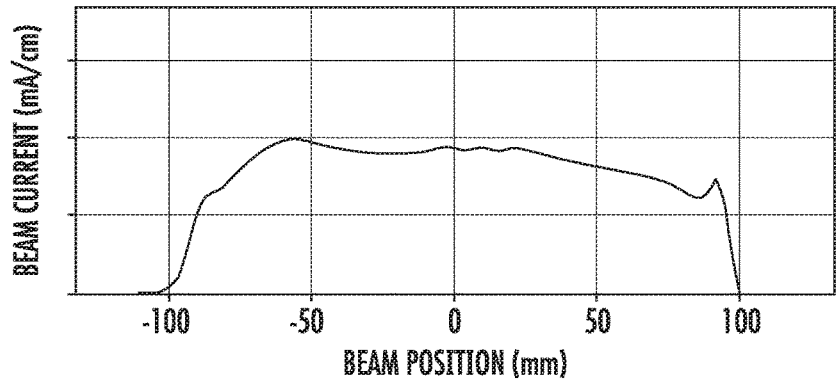
FIGS. 3A-3C show the effect that changing the bias voltages may have on the ribbon ion beam.
Figure 3B:
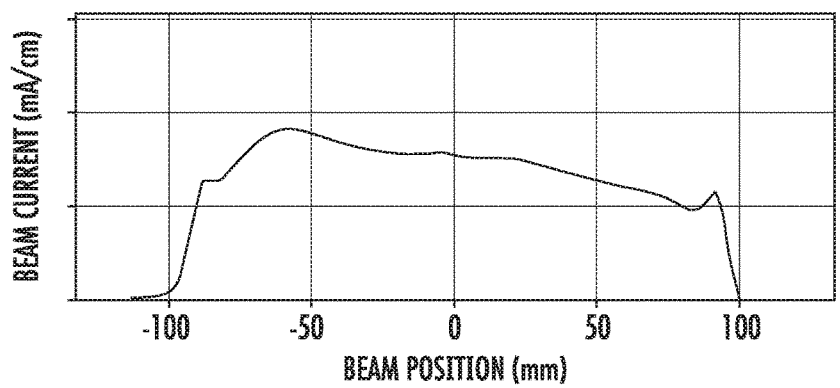
Figure 3C:
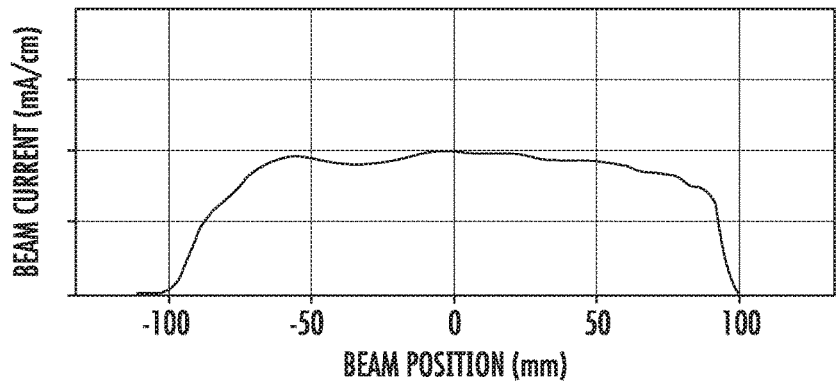

Unexpectedly, the dual cathode ion source 100 may also be used to adjust the uniformity of the ribbon ion beam 1. For example, in one experiment, a ribbon ion beam made up of arsenic ions was created at an energy of 30 keV. The beam current, uniformity and beam angles, as a function of beam position of the ribbon ion beam, were measured by the beam profiler 240. FIGS. 3A-3C show the beam profile, measured in mA/cm, at the plane of the workpiece. In these figures, a beam position of 0 mm is defined as the middle of the ribbon ion beam 1, negative values of beam position are to the left of the middle of the ribbon ion beam 1 and positive values of beam position are to the right of the middle of the ribbon ion beam. The vertical axis is representative of the beam current density at that position. In FIG. 3A, the first bias power supply 135a and the second bias power supply 135b are set to the same output (i.e. the same bias voltage or same bias current). As seen in FIG. 3A, the left side of the ribbon ion beam 1 has somewhat higher beam current than the right side. Further, the ribbon ion beam has fairly good uniformity from about −50 mm to 25 mm. Outside this range, the uniformity of the ribbon ion beam degrades. FIG. 3B shows how this non-uniformity can be exacerbated by increasing the magnitude of the bias voltage (or current) supplied by the first bias power supply 135a as compared to the magnitude of the output of the second bias power supply 135b. In fact, the beam current on the left side is actually twice the beam current on certain positions on the right side. Further, the beam current decreases almost linearly as a function of beam position from about −50 mm and about 75 mm. However, as shown in FIG. 3C, by increasing the bias voltage (or current) supplied by the second bias power supply 135b as compared to the first bias power supply 135a, the resulting ribbon ion beam is much more uniform. In fact, the ribbon ion beam is roughly uniform from about −60 mm to about 60 mm. Thus, the ribbon ion beam of FIG. 3A may be improved by independently modifying the outputs of the bias power supplies 135a, 135b. In some embodiments, the uniformity may be improved when the output of the first bias power supply 135a differs from the output of the second bias power supply 135b.

Similar trends were also found when experimenting with ribbon ion beams made up of phosphorus ions. These effects were created by varying the outputs of the bias power supplies 135a, 135b by between about 1% and 5%. Of course, the outputs of the bias power supplies may be varied differently, depending on the implementation.

The ability to affect the beam current of the ribbon ion beam using the first bias power supply 135a and the second bias power supply 135b allows a new method of tuning the ribbon ion beam 1. Additionally, the beam current may be affected by varying the outputs of the first arc power supply 140a and second arc power supply 140b. Additionally, the beam current may also be affecting by varying the outputs of the first filament power supply 125a and the second filament power supply 125b.

Figure 4:
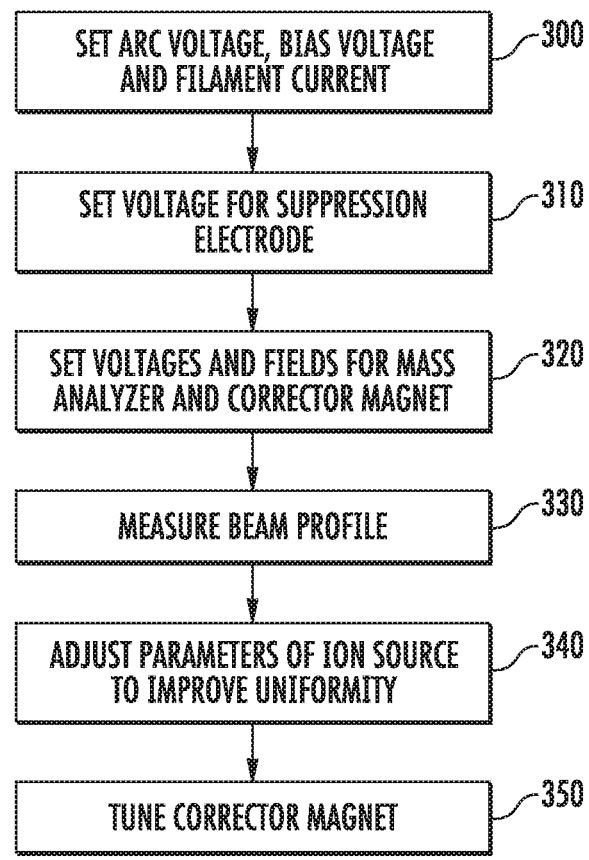
FIG. 4 shows a sequence to tune a ribbon ion beam using the ion implanter of FIG. 2.

In one embodiment, the ion implanter 250 of FIG. 2 may be used to tune the ribbon ion beam 1 to improve its uniformity. FIG. 4 shows a sequence that may be used to achieve improved uniformity.

First, as shown in Process 300, the parameters of the ion source 100 is initially configured. This initial configuration includes setting the arc voltages, the bias voltages and the filament currents of the ion source 100. In certain embodiments, the filament currents for the filaments 120a, 120b are set to the same initial levels. Similarly, in certain embodiments, the bias voltages for the two cathodes 130a, 130b are set to the same initial voltage. Additionally, in certain embodiments, the arc voltages for the two cathodes 130a, 130b are set to the same initial voltage.

After the parameters for the ion source 100 are configured, the voltage for the suppression electrode 160 is established, as shown in Process 310. This voltage helps determine the extracted shape (focus and angle) of the ribbon ion beam 1.

The extraction voltage, which determines the final ion beam energy, the deceleration voltage, which determines the beam transport energy through the beamline and the magnetic fields for the mass analyzer 200 and corrector magnet 220 are also configured, as shown in Process 320. Note that Process 310 and Process 320 may be performed in the opposite order, if desired.

Once the ion source 100, the suppression electrode 160, the mass analyzer 200 and the corrector magnet 220 are configured, a ribbon ion beam 1 can be generated. This ribbon ion beam 1 passes through the ion implanter 250 and strikes the beam profiler 240, so that the beam current can be measured as a function of beam position. For example, the beam profiler 240 may determine that the ribbon ion beam has the current profile shown in FIG. 5A.

Figure 5A:
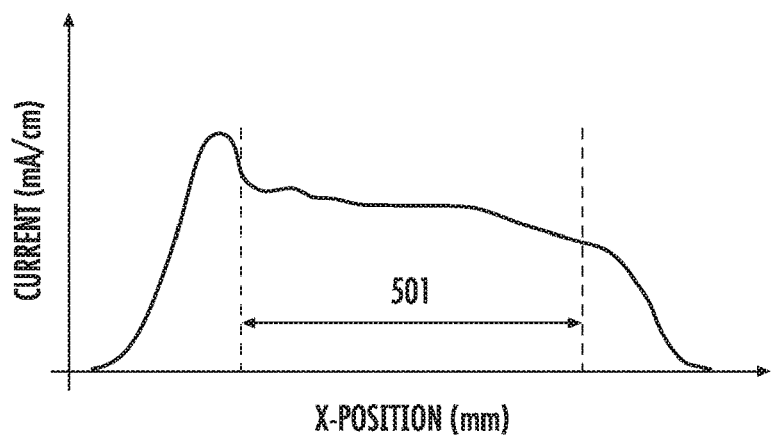
FIGS. 5A-5C show how the ribbon ion beam may be tuned according to one embodiment.

The graph in FIG. 5A shows the beam current as a function of beam position. The interval 501 denotes the part of the ribbon ion beam 1 that will impact the workpiece. This interval 501 may also be referred to as the region of interest. In certain embodiments, this region of interest may be 300 mm, although other dimensions are also possible. As can be seen, the left side of the ribbon ion beam 1 has greater beam current density than the right side of the ribbon ion beam 1. In fact, there is a near linear decrease in the beam current density from the left end of interval 501 to the right end of interval 501.

This information may be passed to the controller 245. The controller 245, based on the beam profile received from the beam profiler 240, may determine a change to be applied to the parameters of the ion source 100. As described above, the parameters of the ion source 100 include the bias voltage applied to each cathode 130a, 130b, the current applied to each filament 120a, 120b, and the arc voltage applied between each cathode 130a, 130b and the chamber walls 111.

For example, the controller 245 may apply a change in the bias voltage supplied to one or both of the cathodes 130a, 130b. For example, the controller 245 may increase the magnitude of the voltage supplied by second bias power supply 135b, decrease the magnitude of the voltage supplied by first bias power supply 135a, or a combination of these two actions. Alternatively, or additionally, the controller 245 may adjust the current passing through one or both of the filaments 120a, 120b by varying the outputs of filament power supplies 125a, 125b. Further, in certain embodiments where two arc power supplies are used, the controller 245 may control the arc voltages so that each cathode 130a, 130b is independently biased relative to the chamber walls 111. The changes to the parameters of the ion source 100 are shown in Process 340.

Figure 5B:
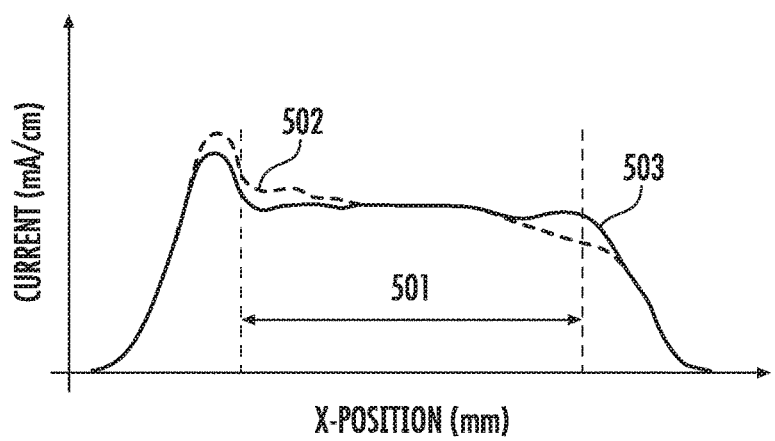

After modifying the parameters in the ion source 100, the change in the ribbon ion beam 1 is then monitored by the beam profiler 240. For example, after adjusting the filament currents, bias voltages, the arc voltages or a combination of these, the profile of the ribbon ion beam 1 may become as shown in FIG. 5B.

The dotted line 502 reflects the original beam current profile before Process 340. The solid line 503 reflects the beam current profile after Process 340. After the parameters of the ion source 100 have been adjusted, any final tuning of the ribbon ion beam 1 may be performed by modifying the components in the corrector magnet 220, as shown in Process 350. In certain embodiments, the adjustment of the parameters of the ion source 100 occurs before the tuning of the corrector magnet 220.

Figure 5C:
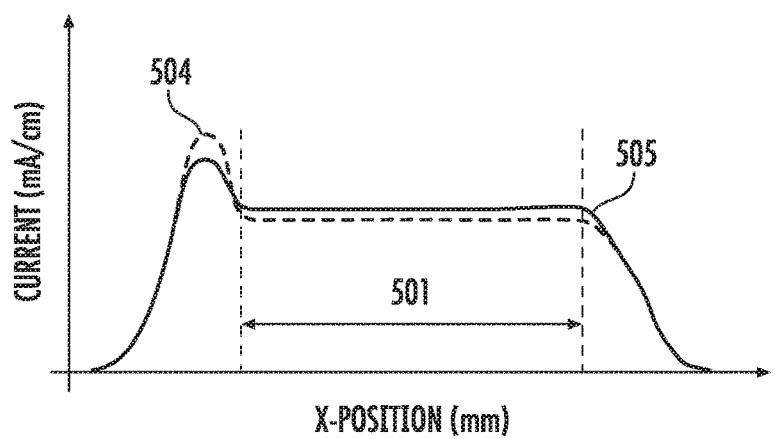

FIG. 5C shows the resulting ribbon ion beam 1 after completion of the sequence shown in FIG. 4. The solid line 505 reflects the resulting beam profile after the entire sequence shown in FIG. 4 is performed. For comparison, the dotted line 504 shows the resulting beam current profile if the parameters of the ion source 100 are not varied in Process 340. Note that by varying the parameters of the ion source 100, the resulting beam current is increased. Further, the overall shape of the beam profile is improved in this embodiment, as the beam current is more uniform through the interval 501. Furthermore, since less tuning is performed by the corrector magnet 220, the parallelism of the individual ion beamlets may be improved. Further, one of the benefits is that the beam tuning time/sequence can be shortened.

Thus, in one embodiment, an ion implanter 250 is disclosed, where the ion implanter 250 includes the ion source 100 of FIG. 1 and a controller 245. Based on measurements of the ribbon ion beam from the beam profiler 240, the controller 245 manipulates the parameters of the ion source 100 to tune the ribbon ion beam 1. These parameters may include varying the bias voltage supplied to each cathode 130a, 130b so that these bias voltages are not equal. Note that this is possible due to the presence of a first bias power supply 135a and a second bias power supply 135b. In other embodiments, the controller may vary the current passing through each filament 120a, 120b so that these currents are not equal. Note that this is possible due to the presence of a first filament power supply 125a and a second filament power supply 125b. Finally, in certain embodiments, the arc voltages can be varied such that the outputs of arc power supply 140a, 140b are not equal. Again, this is possible due to the presence of a first arc power supply 140a, and a second arc power supply 140b.

The present apparatus has many advantages. First, in current implementations, the adjustments to the corrector magnet 220 are used to compensate for non-uniform beam current. These adjustments typically reduce the overall beam current and also introduce some degree of non-parallelism between individual ion beamlets. The tuning of parameters of the ion source 100, such as the bias voltage applied to each cathode 130a, 130b, reduces the amount of non-uniformity. Consequently, less compensation is performed by the corrector magnet 220, and the beam current is greater and the parallelism is improved. Furthermore, because more control can be exercised over the uniformity of the ion beam by varying the parameters of the ion source 100, the time to perform the other tuning processes, such as adjusting the components of the corrector magnet 220, can be reduced.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implanter, comprising:
   an ion source, comprising:
   a first end wall and a second end wall;
   chamber walls connected to the first end wall and the second end wall to define an ion source chamber, wherein one of the chamber walls comprises an extraction aperture, wherein a ribbon ion beam is extracted through the extraction aperture;
   a first cathode disposed proximate the first end wall;
   a first filament disposed between the first end wall and the first cathode;
   a first bias power supply to bias the first cathode relative to the first filament;
   a first filament power supply to supply a first current to the first filament;
   a second cathode disposed proximate the second end wall;
   a second filament disposed between the second end wall and the second cathode;
   a second bias power supply, different from the first bias power supply, to bias the second cathode relative to the second filament; and
   a second filament power supply to supply a second current to the second filament;
   a beam profiler for measuring a beam current of the ribbon ion beam as a function of beam position; and
   a controller, wherein the controller is in communication with the ion source and the beam profiler, such that the controller determines a uniformity of beam current of the ribbon ion beam passing through the extraction aperture based on input from the beam profiler and independently controls the output of the first bias power supply and the second bias power supply so as to improve the uniformity of beam current of the ribbon ion beam.

2. The ion implanter of claim 1, wherein an output of the first bias power supply is different from an output of the second bias power supply, so as to change the uniformity of the ribbon ion beam extracted through the extraction aperture.

3. The ion implanter of claim 1, further comprising a first arc power supply to bias the first cathode relative to the chamber walls and a second arc power supply, different from the first arc power supply, to bias the second cathode relative to the chamber walls.

4. The ion implanter of claim 3, wherein an output of the first arc power supply is different from an output of the second arc power supply so as to change the uniformity of the ribbon ion beam extracted through the extraction aperture.

5. The ion implanter of claim 3, further comprising a controller to independently control an output of the first arc power supply and the second arc power supply, wherein the controller independently controls the output of the first arc power supply and the second arc power supply.

6. The ion implanter of claim 5, wherein the controller controls the output of the first arc power supply and the second arc power supply to vary the uniformity of the ribbon ion beam passing through the extraction aperture.

7. The ions implanter of claim 1, wherein the controller controls the output of the first filament power supply and the second filament power supply to improve the uniformity of the ribbon ion beam passing through the extraction aperture.

8. The ion implanter of claim 1, further comprising a corrector magnet, wherein the controller controls the corrector magnet to improve the uniformity of beam current of the ribbon ion beam after adjusting the output of the first bias power supply and the second bias power supply.

9. The ion implanter of claim 1, wherein the controller independently varies an output of the first filament power supply and the second filament power supply so as to adjust the first current and the second current, so that electrons are emitted from the first cathode and the second cathode.

10. A method of improving a uniformity of a ribbon ion beam extracted from a dual cathode ion source, comprising:
    measuring a current of the ribbon ion beam across its length at a plane of a workpiece; and
    adjusting a parameter of the dual cathode ion source to improve the uniformity of the ribbon ion beam in response to a measured current, wherein the parameter of the dual cathode ion source is selected from the group consisting of a voltage between a first filament and a first cathode; and a voltage between a second filament and a second cathode.

11. The method of claim 10, wherein the uniformity is improved by making the voltage between the first filament and the first cathode different from the voltage between the second filament and the second cathode.

12. The method of claim 10, wherein the uniformity is improved by making the voltage between the first cathode and the wall of the dual cathode ion source different from the voltage between the second cathode and the wall of the dual cathode ion source.

13. The method of claim 10, wherein the uniformity is improved by making the current flowing through the first filament different from the current flowing through the second filament.

* * * * *